(12) United States Patent
Williams et al.

(10) Patent No.: US 12,408,256 B1
(45) Date of Patent: Sep. 2, 2025

(54) PLASMA CLEANING DEVICE AND PROCESS

(71) Applicant: Surfx Technologies LLC, Redondo Beach, CA (US)

(72) Inventors: Thomas Scott Williams, Los Angeles, CA (US); Quoc Dinh Truong, Norwalk, CA (US); Robert F. Hicks, Los Angeles, CA (US)

(73) Assignee: Surfx Technologies LLC, Redondo Beach, CA (US)

( * ) Notice: Subject to any disclaimer, the term of this patent is extended or adjusted under 35 U.S.C. 154(b) by 875 days.

(21) Appl. No.: 17/156,561

(22) Filed: Jan. 23, 2021

Related U.S. Application Data

(62) Division of application No. 15/791,353, filed on Oct. 23, 2017, now Pat. No. 10,923,331.

(60) Provisional application No. 62/411,564, filed on Oct. 22, 2016.

(51) Int. Cl.
  *H05H 1/46* (2006.01)
  *B08B 7/00* (2006.01)

(52) U.S. Cl.
  CPC .............. *H05H 1/46* (2013.01); *B08B 7/0035* (2013.01)

(58) Field of Classification Search
  CPC .............................. H05H 1/46; B08B 7/0035
  See application file for complete search history.

(56) References Cited

U.S. PATENT DOCUMENTS

| | | | |
|---|---|---|---|
| 4,822,450 A * | 4/1989 | Davis | C23C 16/54 |
| | | | 156/345.35 |
| 5,198,724 A | 3/1993 | Koinuma et al. | |
| 5,653,812 A * | 8/1997 | Petrmichl | C23C 16/509 |
| | | | 118/728 |
| 5,961,772 A | 10/1999 | Selwyn | |
| 5,977,715 A | 11/1999 | Li et al. | |
| 6,079,358 A | 6/2000 | Kim et al. | |
| 6,730,238 B2 | 5/2004 | Li et al. | |
| 7,329,608 B2 | 2/2008 | Babayan et al. | |
| 8,328,982 B1 | 12/2012 | Babayan et al. | |
| 8,632,651 B1 | 1/2014 | Hicks et al. | |
| 10,827,601 B1 * | 11/2020 | Williams | H05H 1/24 |
| 10,923,331 B1 * | 2/2021 | Williams | H05H 1/4697 |

(Continued)

FOREIGN PATENT DOCUMENTS

| | | | | |
|---|---|---|---|---|
| EP | 3607909 A1 * | 2/2020 | | A61C 8/0013 |
| JP | 2005033181 A * | 2/2005 | | H01L 21/67248 |

OTHER PUBLICATIONS

JP 2005033181 A Written Description (Year: 2005).*

(Continued)

*Primary Examiner* — Alexander Markoff
(74) *Attorney, Agent, or Firm* — Canady & Lortz LLP; Bradley K. Lortz

(57) ABSTRACT

Atmospheric pressure plasma devices and methods for preparing the surfaces of fasteners, e.g. nutplates, for adhesive bonding are disclosed. A device supports a fastener to dispose a contact surface of the fastener to receive an atmospheric pressure plasma flow, thereby activating the contact surface to be bonded. A spacer is used to properly support the fastener to receive the plasma treatment. A spacer can comprise a plurality of standoffs on a showerhead port comprising a ground electrode of the plasma generator where plasma is formed in a gas flow across the electrodes.

10 Claims, 11 Drawing Sheets

(56) References Cited

U.S. PATENT DOCUMENTS

| | | | |
|---|---|---|---|
| 12,120,809 B1* | 10/2024 | Williams | H05H 1/466 |
| 2004/0096581 A1 | 5/2004 | Yashiro et al. | |
| 2006/0156983 A1* | 7/2006 | Penelon | C23C 16/402 |
| | | | 156/345.47 |
| 2010/0071624 A1 | 3/2010 | Lee | |
| 2011/0101862 A1 | 5/2011 | Koo et al. | |
| 2014/0326277 A1* | 11/2014 | Nettesheim | H01J 37/32394 |
| | | | 134/1.1 |
| 2015/0279681 A1* | 10/2015 | Knoops | H01L 21/0228 |
| | | | 427/8 |

OTHER PUBLICATIONS

DE 102011056696 (Year: 2016).*

Schutze et al., "The Atmospheric-Pressure Plasma Jet: A Review and Comparison to other Plasma Sources," IEEE Transactions in Plasma Science, vol. 26, p. 1685 (1998).

Eliasson et al., IEEE Transactions in Plasma Science, vol. 19, p. 1063, 1991.

Stark et al., Applied Physics Letters, vol. 74, p. 3770, 1999.

Bardos et al., Surface Coating Technologies, vol. 133-134, p. 522, 2000.

Zaldivar et al., Journal of Applied Polymer Science, vol. 120, p. 921, 2010.

Zaldivar et al., Journal of Composite Materials, vol. 44, p. 137, 2010.

Moravej et al., Plasma Sources Science and Technology, vol. 13, p. 8, 2004.

Gonzalez et al., Plasma Processes and Polymers, vol. 7, p. 482, 2010.

Gonzalez et al., Langmuir, vol. 24, p. 12636, 2008.

Gonzalez et al, IEEE. Transactions on Plasma Science, vol. 37, p. 823, 2009.

Gonzalez et al., Langmuir, vol. 26, p. 3710, 2010.

Williams et al., Journal of Composite Materials, vol. 48, p. 219, 2014.

Williams et al., Journal of Adhesion Science and Technology, vol. 28, p. 653, 2014.

Harris et al., Proceedings of SAMPE Spring Technical Meeting, 2011.

Yu et al., Carbon, vol. 57, p. 11, 2013.

* cited by examiner

PLASMA CLEANING DEVICE AND PROCESS

CROSS-REFERENCE TO RELATED APPLICATIONS

This continuation application claims the benefit under 35 U.S.C. § 120 of the following and commonly assigned U.S. utility patent application:

U.S. patent application Ser. No. 15/791,353, filed Oct. 23, 2017, and entitled "PLASMA CLEANING DEVICE AND PROCESS," by Williams et al. which claims the benefit under 35 U.S.C. § 119(e) of U.S. Provisional Patent Application No. 62/411,564, filed Oct. 22, 2016, and entitled "PLASMA CLEANING DEVICE AND PROCESS," by Williams et al.

STATEMENT OF GOVERNMENT RIGHTS

This invention was made with Government support under contract No. FA8650-13-C-5020 awarded by the United States Air Force. The Government has certain rights in this invention.

BACKGROUND OF THE INVENTION

1. Field of the Invention

The disclosure relates to a plasma device for treating a bond area of fasteners and nutplates made from a thermoplastic polymer, thermoset resin, metal or metal alloy. The method described relates generally to adhesively bonding a nutplate to another work piece having at least one bond area, and more specifically, preparing surfaces by processes including plasma treatment without the need for mechanical abrading and/or wet chemical treatment. An atmospheric pressure plasma is applied to the nutplates to provide surface cleaning and generate a high energy surface. An operator holds the nutplate by hand and inserts it into the plasma device, whereby the reactive gasses generated by the plasma interacts with the surface to improve the material properties. The cleaning and activation process is well suited for improving the adhesion to glue, primer and other adhesion promoting coatings. This process yields increased adhesive strength under both tension and torsional loads. Plasma surface preparation removes foreign contaminants from the metallic nutplates and terminates the surface with functional groups to achieve strong adhesion with bond primers, glues, material coatings, etc.

2. Description of the Related Art

When products are manufactured, many of the components are joined together using adhesives. The bond made with the adhesive must not fail throughout the useful life of the product. A list of products where adhesive bonding is a critical part of the manufacturing process includes, but is not limited to, automobiles, aircraft, boats, helicopters, trains, rockets, satellites, medical devices, sports equipment, storage tanks, pipelines, telecommunications equipment, computers, smart phones, televisions and appliances.

Carbon-fiber-reinforced composites are being used more and more frequently in the aerospace industry, due to their superior strength-to-weight ratio compared to metals. In large commercial aircraft, composites are frequently employed. However, their use has been somewhat restricted, due to the difficulty in joining the composites together reliably and with the durability necessary to ensure safe operation of the aircraft throughout its service life.

Materials can be joined using a variety of techniques. Traditional joining methods include riveting, welding or screwing. It has been found, however, that a variety of drawbacks are associated with these traditional joining methods. When the assembly is under load, for example, there are very high stress peaks at the joints. Furthermore, traditional assemblies of this kind may be subject to corrosion, especially when different materials are joined.

Riveted nutplates necessitate the drilling of two additional holes into the substrate in order to accept the rivets. Drilling these holes can potentially damage the surface and the underlying structure. By adhesively bonding the nutplates, the additional holes are not needed, and damage to the structure is avoided. Moreover, the use of adhesively bonded, rivet-less nutplates improves structural integrity. The adhesive promotes a uniform distribution of stress over the entire bond area, which enhances both the static and dynamic bond strength. Additionally, adhesively bonded nutplates can be installed in a fraction of the time required for the installation of riveted nutplates, thereby greatly reducing manufacturing and repair costs.

While these savings are a significant advantage, preparation of the material surface before nutplate bonding is a crucial step in obtaining a strong, durable joint. Nutplates and other adhesively bonded fasteners can be made from a variety of different materials. These baseplate materials include aluminum, stainless steel, titanium, thermoplastics, thermosets, and composites materials of fiber glass/epoxy or carbon fiber/epoxy.

During the assembly of aerospace structures, mechanics must insert and tighten down many thousands of fasteners and nutplates. Before applying an adhesive to the nutplate, the mechanic is required to clean and activate its surface. This is generally accomplished by solvent wiping and hand sanding the nutplate. This process is tedious and time consuming, and is often done improperly. An improperly prepared surface will yield weak joints that fail during use and result in expensive repairs. Therefore, there is a need for a surface preparation process that can be applied efficiently and reliably, and produces a strong, durable bond between the nutplate and the aircraft component.

Alternative methods exist which are effective in limiting adhesive bond failure at the nutplate interface. Metal surfaces can be anodized through multistage processes using wet chemical baths. The wet chemical solutions employ strong acids and copious rinsing with distilled water. Disposal of the hazardous waste from these operations is a big concern. Anodizing produces a porous surface, which allows for the penetration of subsequent bond primer into the microstructure. The result is increased adhesion through mechanical interlocking.

A recent advancement in nutplate preparation is the use of laser ablation for the surface preparation of nutplates. The laser ablation process consists of focusing a laser beam on the sample, and blasting away the top layer of material. This process produces a rough, high-energy surface suitable for making a strong adhesive bond. However, laser ablation systems are extremely expensive, and have a large, heavy footprint that cannot be accommodated in many manufacturing or repair situations.

An alternative way to prepare a surface for bonding, is to treat it with the reactive gas from a low-temperature plasma. This dry plasma process can be used for cleaning and preparing structures as a replacement for abrasion or hazardous chemical treatment. Plasmas are ionized gases that are generated by applying an electrical signal to a powered and grounded electrode with sufficient energy to break down the gas between the electrodes and cause a current to flow between them (see for example, Lieberman and Lichtenberg, "*Principles of Plasma Discharges and Materials Processing,*" John Wiley & Sons, Inc., New York, 1994; Chen, "*Introduction to Plasma Physics and Controlled Fusion,*" Plenum Press, New York, 1984; and Roth, "*Industrial Plasma Engineering Vol. I, Princples*" Institute of Physics Publishing, Philadelphia, PA, 1995). Energetic electrons in the plasma break apart molecules, including, but not limited to, $O_2$, producing O atoms. These O atoms react with organic contaminants on surfaces, and oxidize away the organics as $CO_2$ and $H_2O$. In addition, the O atoms will oxidize the material surface, and create functional groups that will covalently bond to glue, ink, paint, and coatings. Another beneficial aspect of plasma processes is that they produce no hazardous waste.

Low-temperature plasma activation offers the ability to modify surfaces without affecting the bulk properties. This makes plasma an effective tool for the surface preparation of materials prior to bonding. Plasma activation is performed using technologies that fall into one of two categories: vacuum-based systems, or those which operate in open air (see for example, Lieberman and Lichtenberg, "*Principles of Plasma Discharges and Materials Processing,*" John Wiley & Sons, Inc., New York, 1994; Chen, "*Introduction to Plasma Physics and Controlled Fusion,*" Plenum Press, New York, 1984; and Roth, "*Industrial Plasma Engineering: Vol. I, Principles*" Institute of Physics Publishing, Philadelphia, PA, 1995).

Vacuum-based plasma systems have a number of drawbacks, including the need to limit the size and shape of the components so that they fit inside the chamber, as well as the cost associated with maintaining and operating the vacuum system. Vacuum plasmas cannot be used for on-aircraft repair, because the aircraft contains vacuum incompatible components, and is too large to fit inside a chamber. The nutplates themselves cannot be placed in vacuum plasmas because the silicone fixtures on them are vacuum incompatible. By contrast, atmospheric pressure plasmas may be employed on aircraft during assembly and repair.

Low-temperature, atmospheric pressure plasmas are weakly ionized discharges, such that only a small fraction of the gas molecules become ionized (see Schütze, et al., "*The Atmospheric—Pressure Plasma Jet: A Review and Comparison to other Plasma Sources,*" IEEE Transactions in Plasma Science, vol. 26, page 1685 (1998)). These systems are not at equilibrium, because the temperature of the free electrons is several orders of magnitude higher than the temperature of the neutral species. The reactive neutral species produced in the atmospheric pressure plasma (for example, oxygen atoms) flow out of the device and over the material surface to be treated. Since the reactive gas temperature is low, no thermal damage occurs to the material, which can be made of plastic, polymer composites, metal, glass, or ceramics. Several types of non-equilibrium, atmospheric pressure plasmas have been developed. These include coronas, dielectric barrier discharges, micro hollow cathode discharges, arc-type plasma torches, and radio frequency powered, capacitive discharges (see Goldman and Goldman, "*Corona Discharges*" Gaseous Electronics, vol. 1, (Eds: Hirsh and Oakam), Academic Press, New York, 1978; Eliasson and Kogelschatz, IEEE Transactions in Plasma Science, vol. 19, page 1063, 1991; Stark and Schoenbach, Applied Physics Letters, vol. 74, page 3770, 1999; Bardos and Barankova, Surface Coating Technologies, vol. 133-134, page 522, 2000; Koinuma et al., U.S. Pat. No. 5,198, 724; Li et al., U.S. Pat. Nos. 5,977,715 and 6,730,238; and Selwyn, U.S. Pat. No. 5,961,772). The byproducts of sputtering, which can occur using some of these styles of plasma generation, have the potential to contaminate the material being treated. In addition, they do not work well as handheld tools.

Babayan and Hicks (U.S. Pat. Nos. 8,328,982 and 7,329, 608) describe multiple atmospheric pressure, radio-frequency plasmas. Neutral reactive gas species are produced in the plasma and flow out of the device and may be used to treat substrates placed a short distance downstream. Such a device can treat a wide variety of material, including polymers, composites, metals, and glass. This plasma device uses an inert carrier gas, helium or argon, operates at low voltages (100 to 300 V), low power (20 to 200 W per 2.5 cm of beam width), and low temperature (<120° C.). It has been shown that even though the power and temperature are low in this atmospheric pressure plasma, this type of device treats the surface of materials at a relatively fast rate (see R. F. Hicks and S. Babayan, U.S. Pat. No. 8,632,651, Jan. 21, 2014; R. J. Zaldivar et al., Journal of Applied Polymer Science, vol. 120, page 921, 2010; R. J. Zaldivar et al., Journal of Composite Materials, vol. 44, page 137, 2010; R. J. Zaldivar et al, Journal of Composite Materials, vol. 44, page 137, 2010; A. Schutze et al., IEEE Transactions on Plasma Science, vol. 26, page 1685, 1998; M. Moravej et al., Plasma Sources Science and Technology, vol. 13, page 8, 2004; E. Gonzalez et al., Plasma Processes and Polymers, vol. 7, page 482, 2010; E. Gonzalez et al., Langmuir, vol. 24, page 12636, 2008; E. Gonzalez et al, IEEE. Transactions on Plasma Science, vol. 37, page 823, 2009; E. Gonzalez and R. F. Hicks, Langmuir, vol. 26, page 3710, 2010; T. S. Williams et al., Journal of Composite Materials, vol. 48, page 219, 2014.; T. S. Williams et al, Journal of Adhesion Science and Technology, vol. 28, page 653, 2014.; E. W. Harris et al., Proceedings of SAMPE Spring Technical Meeting, 2011.; H. Yu et al., Carbon, vol. 57, page 11, 2013). These publications have shown that the RF plasma is effective for cleaning and adhesion promotion on many materials, including, but not limited to, silicon dioxide, ceramics, metals, carbon nanotubes, carbon-fiber-reinforced composites and polymers. Polymers that may be cleaned and activated with the atmospheric plasma include, but are not limited to, polyethylene (PE), polypropylene (PP), polystyrene (PS), nylon, polyethyleneterephthalate (PET), polymethylmethacrylate (PMMA), polyetheretherketone (PEEK), polyethylenenaphthalate (PEN), polyethersulfone (PES), and polysulfone (PSU).

Atmospheric pressure plasmas are employed in many industries to prepare surfaces for adhesion. Large area plasmas are employed in roll-to-roll setups for treating plastic film used in packaging. Alternatively, spot plasmas are mounted on robots and scanned over the 3-dimensional surfaces of metal and plastic parts, during the assembly of automobiles and aircraft. Nevertheless, no plasma device exists that is suitable for treating the small, 3-dimensional bond surfaces of fasteners and nutplates.

In particular, there is a need for an atmospheric pressure plasma device with a small profile that controls exposure of the reactive gas to the bonding surface only, and enables handheld, point-of-use preparation of fasteners and nutplates. In order for mechanics to operate the plasma tool without risk, it must be low voltage and low temperature. A process that is fast, runs in open air, easily integrates into nutplate installation, and produces strong, durable bonds, would greatly enhance the state-of-the-art. The present invention is one such process. Embodiments of the invention are a device and method for preparing the surfaces of fasteners and nutplates for adhesive bonding.

SUMMARY OF THE INVENTION

The invention is embodied in a plasma device and its method of preparing the surfaces of fasteners and nutplates for adhesive bonding. One embodiment of the plasma tool utilizes a showerhead configuration to prepare nutplates by downstream activation with the reactive gases exiting the device. Another embodiment of the invention generates the plasma directly in contact with the nutplate surface. In one embodiment, the plasma device is used to clean and activate the surface of fasteners and nutplates prior to bonding. The plasma is fed with a reactive gas selected from oxygen, nitrogen and hydrogen. The reactive gas species are suitable for treating material surfaces, including, but not limited to, metals, plastics, composites, ceramics, thermosets and thermoplastics. The method for treating a bond area of a bonded nutplate or fastener includes accurately and reliably cleaning the bond area and activating the bonding surface before applying an adhesive to the bond area; bringing the nutplate or fastener into contact with the other workpiece, and curing the adhesive. Plasma activation of the nutplates provides a surface water contact angle of <5°. Plasma surface treatment is shown to produce strong, durable bonds between the metal and an organic matrix composite. Plasma activation of the fastener and nutplate before installation generates bondlines with a substantially lower adhesive failure mode than samples prepared using other techniques obvious to those skilled in the art.

To overcome the limitations in the prior art, and to overcome other limitations that will become apparent upon reading and understanding the specification, the invention is directed to a plasma device and its method of use for the surface preparation of adhesively bonded nutplates. Particularly, the invention is related to a device for generating a low voltage, low temperature, atmospheric pressure plasma that can be hand operated, and used for precise surface treatment of nutplates prior to bonding. The plasma device is lightweight, compact, and easily fits into any manufacturing environment.

In one embodiment, the low temperature, atmospheric pressure plasma is enclosed within a housing about the size of a coffee cup. Nutplates are inserted into the housing and exposed to the plasma at a fixed distance, usually less than ten millimeters, and for a controlled period of time, usually less than one minute. The plasma device is configured to treat fasteners and nutplates of multiple sizes and designs. It cleans and activates for bonding many different fasteners and nutplates that are not conveniently or economically processed via other means.

In one embodiment, the plasma device is used to treat fasteners and nutplates using a showerhead design for plasma generation. A high density of reactive species is generated within the device. These species flow out of the showerhead and onto a substrate that is fixed a short distance away. Small pins on the plasma applicator control the distance and ensure the proper intensity of treatment. The device may include a timer for stopping the process after the allotted exposure time.

The invention is further embodied in alterations to the plasma device to treat nutplates of differing sizes and form factors. A variety of electrode configurations may be employed. One version of the invention consists of an annular design, which generates plasma between the outer housing and the internal powered electrode. The device then directs the reactive gas species to flow parallel to the bottom surface of the nutplate and radially inward toward the center fixture. In this way, the entire bonding surface is thoroughly cleaned and activated prior to the gas being exhausted from the device.

Another embodiment of the device generates plasma directly between the powered electrode and the metallic nutplate. The end cap, which functions as the grounded electrode, features a cutout to accept the nutplate. At least two of the walls formed by the nutplate cutout are shaped so as to create seating faces that align the nutplate during treatment. The dimensions of the seating faces must be such that the bottom surface of the nutplate is maintained at the desired distance to the powered electrode. Once inserted, electrical contact is made between the grounded electrode and the nutplate. By maintaining ground continuity and the proper offset distance, plasma is generated directly beneath the nutplate itself. The reactive species generated by the plasma impinge upon the surface of the nutplate thereby cleaning off contaminants and producing a reactive surface for bonding.

In another embodiment of the invention, interchangeable caps may be placed on the plasma device which also function as grounded electrodes. These caps are easily and rapidly installed to accept and treat different types of fasteners and nutplates.

The device can be outfitted with a number of features, including, but not limited to: a variable indexing hole to accept different sizes of silicone fixtures on the nutplates; a marking mechanism to clearly identify nutplates that have been treated; heat dissipation fins to keep the unit cool during operation; and an insulated top to keep its surface cool while the mechanic is handling it.

Another embodiment of the invention is the use of a clamping mechanism to secure the nutplate or fastener during treatment. The clamp can be multifunctional so as to trigger the plasma to turn on after actuation of the clamp. In addition, the clamp prevents the mechanic from removing the part while it is being treated, thereby guaranteeing proper surface activation.

The invention is further embodied in an electronic interface on the device that allows communication with the main controller and alerts the operator to the system status. Feature may include, but are not limited to, the ability to turn the plasma on and off, to purge the gas lines and to select the treatment recipe. Other embodiments of the invention include, but are not limited to, the incorporation of light-emitting diodes for indicating treatment status.

In an additional embodiment, the plasma head contains a small nozzle, thereby activating difficult to reach areas of the nutplate surface which are otherwise inaccessible. Different interchangeable nozzles are able to attach to the plasma head allowing the operator to treat material surfaces that are difficult to access with only one design of the plasma source.

At least a portion of the gas flowing through the plasma tool is selected from the group consisting of helium, argon, oxygen, nitrogen, hydrogen and mixtures thereof. The reactive species flowing out of the device are used to perform a surface treatment, including, but not limited to, contamination removal, cleaning and activation for adhesion.

Various advantages and features of novelty which characterize the invention are pointed out with particularity to the claims annexed hereto and form a part hereof. For a further understanding of the invention, its advantages, and the objects obtained by its use, reference should be made to the drawings which form a further part hereof, and to the accompanying descriptive matter, in which there is illustrated and described specific examples in accordance with the invention.

Atmospheric pressure plasma devices and methods for preparing the surfaces of fasteners, e.g. nutplates, for adhesive bonding are disclosed. A device supports a fastener to dispose a contact surface of the fastener to receive an atmospheric pressure plasma flow, thereby activating the contact surface to be bonded. A spacer is used to properly support the fastener to receive the plasma treatment. A spacer can comprise beveled edges of a grounded enclosure which electrically connects the contact surface of the fastener to the plasma generator where plasma is formed in a gas flow along the electrodes. Alternately, a spacer can comprise a plurality of standoffs on a showerhead port comprising a ground electrode of the plasma generator where plasma is formed in a gas flow across the electrodes.

A typical embodiment of the invention comprises an apparatus for treating a mechanical fastener with atmospheric pressure plasma including an atmospheric pressure plasma generator receiving a gas flow and electrical power and directing the gas flow through a gap between a powered electrode and a grounded electrode while applying the electrical power across the powered electrode and the grounded electrode to generate the atmospheric pressure plasma in an atmospheric pressure plasma flow, and a spacer for supporting the mechanical fastener above the atmospheric pressure plasma flow in order to expose a contact surface of the mechanical fastener to the atmospheric pressure plasma flow and activate the mechanical fastener surface for bonding.

In some embodiments, the spacer comprises opposing beveled edges of a central rectangular opening for supporting edges of the contact surface of the mechanical fastener. The grounded electrode of the plasma generator can comprise a housing enclosure having the central rectangular opening. In addition, the contact surface of the mechanical fastener can be electrically conductive and make electrical contact with the opposing beveled edges such that a portion of the atmospheric pressure plasma is generated directly between the powered electrode and the contact surface of the mechanical fastener. The contact surface of the mechanical fastener effectively becomes part of the grounded electrode. The central opening can further comprise a central indexing hole for receiving an extended portion of the mechanical fastener and thereby aligning the mechanical fastener in the opening so that the contact surface of the mechanical fastener is uniformly impacted with the atmospheric pressure plasma flow.

In some embodiments, the grounded electrode of the plasma generator can comprise a housing enclosure. The housing enclosure can be cylindrical and the powered electrode can be circular and disposed within the cylindrical housing enclosure, the circular powered electrode supported by an electrical insulator between the cylindrical housing enclosure and the circular powered electrode in order to form the gap between the circular powered electrode and a the housing enclosure of the ground electrode. The gap between the circular powered electrode and a the housing enclosure of the ground electrode can begin as a circumferential passage which turns to a planar passage and ends at a central opening of the cylindrical housing enclosure, the contact surface of the mechanical fastener being disposed at the central opening. The circular powered electrode can comprise a central indexing hole for receiving an extended portion of the mechanical fastener and thereby aligning the contact surface of the mechanical fastener such that the contact surface of the mechanical fastener is uniformly contacted with the atmospheric pressure plasma flow.

In some embodiments, the spacer can comprise a plurality of standoffs supporting the contact surface of the mechanical fastener and maintaining a space to allow the atmospheric pressure plasma flow to uniformly impact the contact surface of the mechanical fastener. The plurality of standoffs can be formed on a showerhead port including a plurality of holes through which the atmospheric pressure plasma flow is directed to the contact surface of the mechanical fastener. The showerhead port can comprise the grounded electrode.

In further embodiments, the contact surface of the mechanical fastener can be impacted with reactive species from an atmospheric pressure plasma containing an inert gas, and a molecular gas selected from the group comprising oxygen, nitrogen, hydrogen, carbon dioxide, and nitrous oxide.

A typical embodiment of the invention comprises a method for treating a mechanical fastener with atmospheric pressure plasma including generating an atmospheric pressure plasma in a housing by flowing gas through a gap between a powered electrode and a grounded electrode and applying electrical power to the powered electrode, directing the atmospheric pressure plasma flow onto a mechanical fastener by mounting the mechanical fastener in an opening in the housing where the atmospheric pressure plasma flows out from between the powered electrode and the grounded electrode, and exposing the surface of the mechanical fastener to the atmospheric pressure plasma flow with a spacer supporting the mechanical fastener above the atmospheric pressure plasma flow. The plasma treated contact surface of the mechanical fastener can then be bonded to a structure by application of an adhesive (or directly to an adhesive primer). Method embodiments of the invention can be further modified according to any of the apparatus embodiment described herein.

Figure 1A:
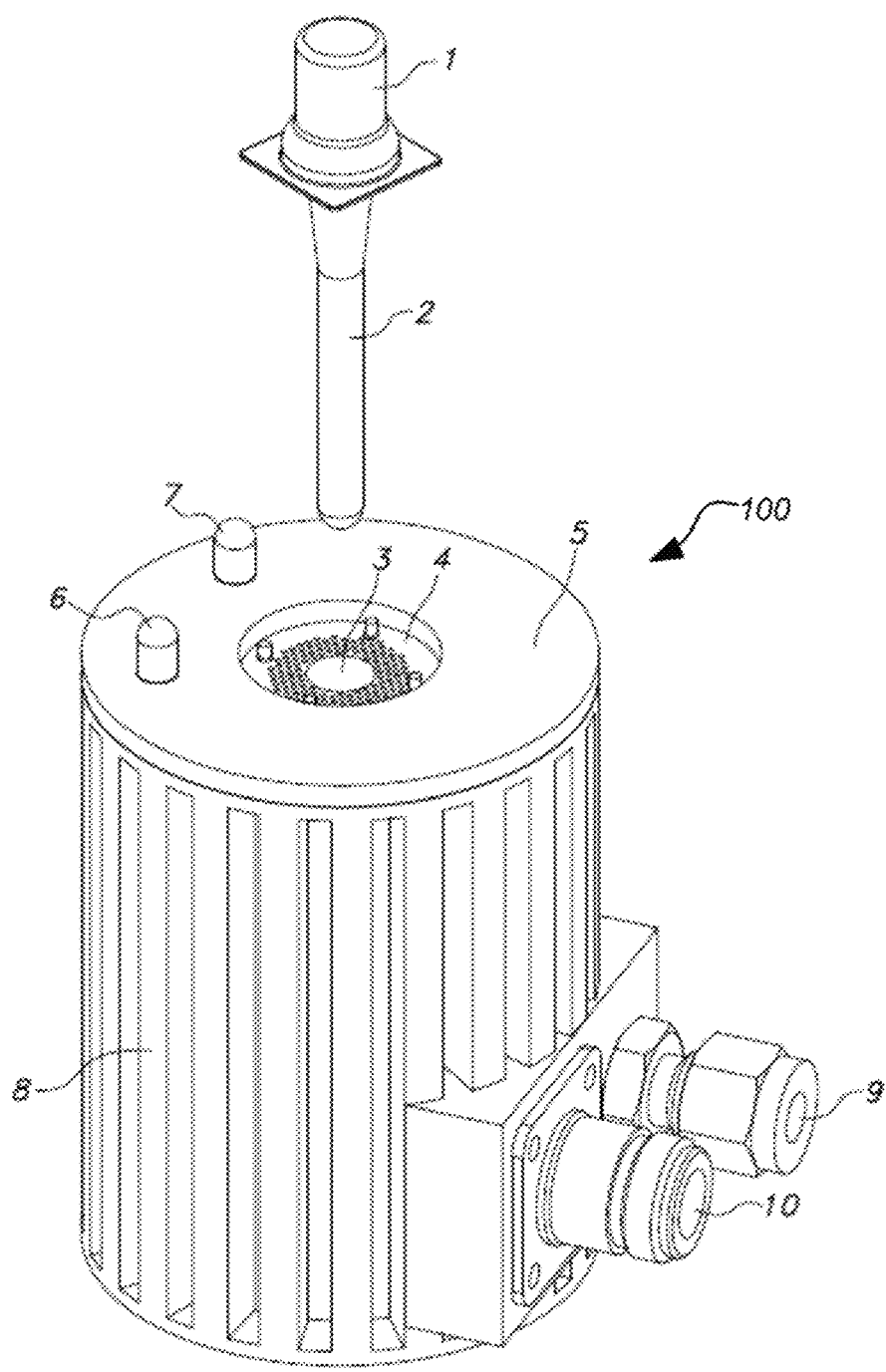
FIG. 1A is a drawing of a plasma device for cleaning and activating nutplates or fasteners prior to adhesive bonding to another substrate. A red LED indicates that it is ready to accept a nutplate for treatment.

It is to be understood that the foregoing general description and the following detailed description are exemplary and explanatory only, and are not to be viewed as being restrictive of the invention as claimed. Further embodiments of this invention will be apparent after a review of the following detailed description of the disclosed embodiments, which are illustrated schematically in the preceding drawings and in the appended claims.

DETAILED DESCRIPTION OF THE PREFERRED EMBODIMENT

In the following description of the preferred embodiments, reference is made to the accompanying drawings, which form a part hereof, and in which is shown by way of illustration the specific embodiment in which the invention may be practiced. It is to be understood that other embodiments may be utilized, and structural and functional changes may be made, without departing from the scope of the invention.

Overview

Various embodiments of the invention are directed to a device and a method for surface treatment of adhesively bonded fasteners and nutplates. The device delivers atmospheric plasma to the surface of fasteners and nutplates prior to joining them to carbon-fiber-reinforced composites, metals, ceramics, and plastics. The invention may be employed to clean a surface through removal of organic contamination. The invention may be employed to activate and functionalize a surface, thereby enhancing adhesion between the fastener, or nutplate and an adhesive, or bond primer.

One embodiment of the invention is a device that is safe to operate in shop environments. The plasma discharge is generated at a low voltage and operates at near room temperature. In this way, a worker can safely insert fasteners or nutplates into the device and prepare them for installation. This aspect of the invention is useful for manufacturing products where manual labor is the most economical method of production. One example where manual labor is employed is the joining of nutplates and other fasteners to structures on jet aircraft. The mechanic may clean and activate 20 to 30 nutplates before applying adhesive to each and installing them on the aircraft. This invention is well suited for this procedure.

Various embodiments of the invention are a device that generates atmospheric pressure plasma with the reactive gas directed onto the relatively small bonding surfaces of fasteners and nutplates. The device for generating the atmospheric pressure plasma may include a showerhead, an annular space that directs the reactive gas flow inward, an annular space that directs the reactive gas flow outward, or any other electrode configuration that would be obvious to those skilled in the art, and would provide effective contacting of the reactive gas with the fastener of the nutplate.

In contrast to the prior art, the invention features a device that incorporates the metallic nutplate into the plasma circuit as a part of the grounded electrode. Gas flows through the one or more flow channels into the volume between the powered electrode and the grounded electrode. Electrical power is delivered to the powered electrode causing a plasma discharge to be struck directly in contact with the nutplate surface. This embodiment of the invention ensures fast and effective treatment of the nutplate.

Another embodiment of the invention includes a plasma applicator incorporated into a low profile, lightweight housing with heat dissipation fins, light-emitting diodes (LEDs), and a switch for turning the plasma on and off. The LEDs indicate whether the plasma is on or off. This aspect of the invention makes it easy to operate the tool quickly without needing to independently interact with the remote controller. Electrical power, process gases, and communication links are provided between the applicator and the remote controller with a cable. Gas containing at least one reactive species produced from the plasma flow out of the device where it contacts the fastener or nutplate and treats its surface by cleaning, activation and functionalization.

In another embodiment of the invention, the plasma device includes hardware and software to indicate to the user when it has successfully completed the treatment of the fastener or the nutplate. This hardware includes, but is not limited to, light-emitting diodes, a digital display, an audible alarm, and other indicators as would be obvious to those with ordinary skill in the art.

Another embodiment of the invention is the incorporation of a marking device into the plasma tool. This device marks the surface of the fastener or nutplate after it has been treated with the plasma, so that the operator knows which parts have been treated.

Another embodiment of the invention includes a nozzle attached to the device, where the reactive gas generated by the plasma is concentrated and redirected towards a surface that is difficult to access due to geometric constraints. The nozzle guides the reactive gas from the plasma onto the surface of the material. The benefit of this configuration is to effectively treat the surfaces of work pieces that are not accessible with other plasma devices. The nozzle provides a means of preserving the reactive gas species so that the said gases fully impinge upon the target surface and quickly clean and activate it for bonding.

Example 1—Plasma Tool for Nutplate Preparation Via Downstream Remote Plasma Activation A schematic of an atmospheric pressure plasma device (100) for fastener and nutplate preparation is shown in FIG.

Figure 2:
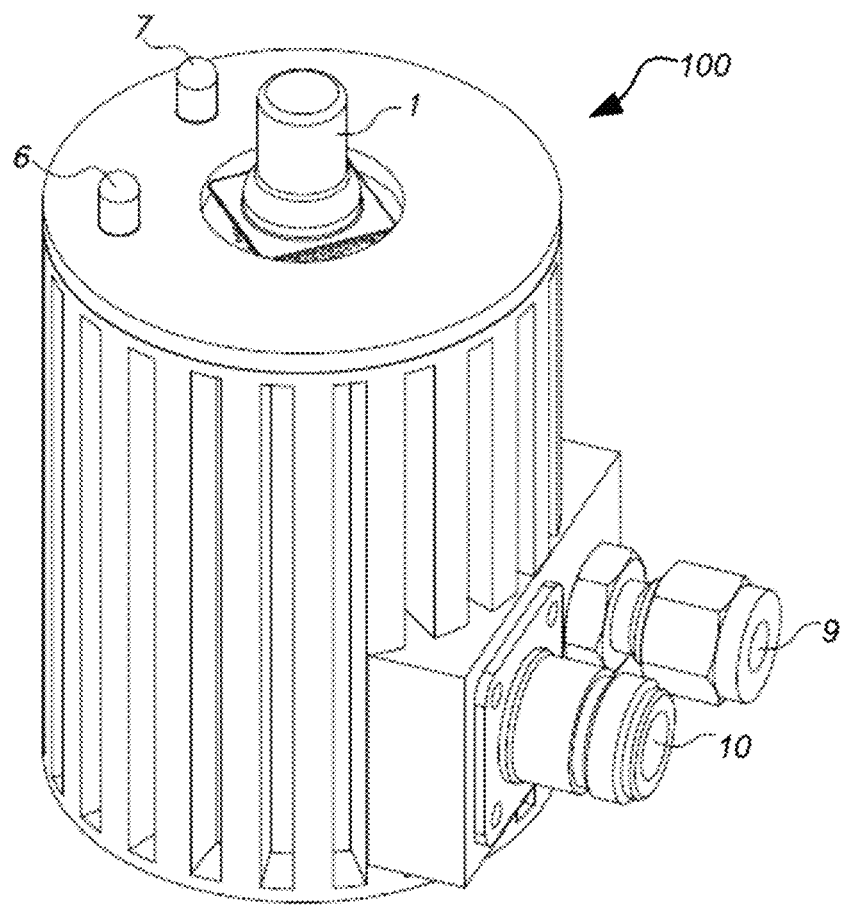
FIG. 2 is a drawing of a plasma device with a dome style nutplate inserted into the housing and being activation by the plasma. A green LED indicates that successful treatment of the nutplate has been completed.

1A. A mechanical fastener (1), e.g. a dome style nutplate with a silicone fixture (2), is cleaned and activated by atmospheric pressure plasma with this device (100). The plasma device (100) contains a central indexing hole (3) that accepts the silicone fixture (2), and a showerhead port (4) disposed around the hole that emits the plasma including the reactive gases therefrom. The insulating end cap (5) has two light emitting diodes (6 and 7) mounted on it. The red LED (6) is lit when the plasma is off. The green LED (7) is lit when the plasma is on, and it blinks when treatment is completed. Heat dissipation fins (8) disposed around the circumference of the device (100) keep the device cool to the touch. Accordingly, these fins (8) are thermally coupled to the electrodes (45), (41) where most heat is generated. A gas inlet (9) and an RF connector (10) provide gas flow and electrical power from the system controller to the plasma device. In FIG. 1A, the mechanical fastener (1) (dome style nutplate with silicone fixture (2)) has not yet been inserted into the device, and the red LED (6) is on. In FIG. 2, the mechanical fastener (1) (dome style nutplate) has been inserted into the device, and the green LED (7) is on, indicating that the plasma is cleaning and activating the nutplate for adhesion.

Figure 1B:
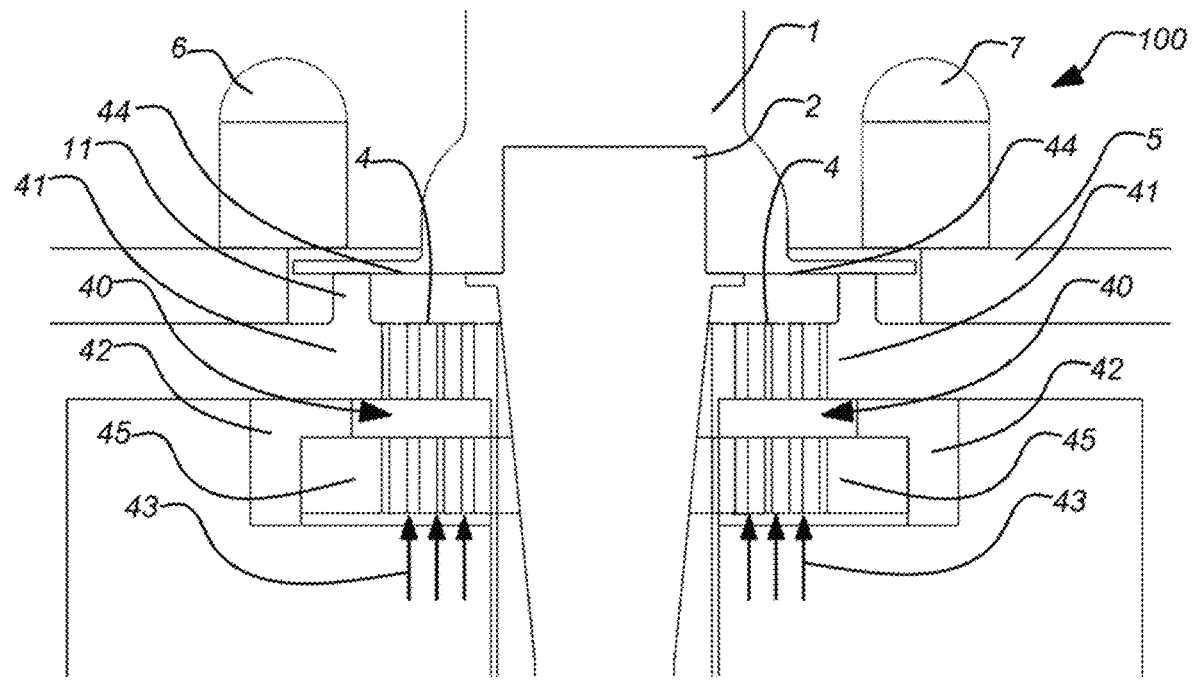
FIG. 1B is a cross section of the plasma device of FIG. 1A.

FIG. 1B is a cross section of the plasma device (100) of FIG. 1A showing the arrangement of electrodes and the gas flow from which the atmospheric pressure plasma is generated. The gas flow (43) is directed through a plurality of holes in a powered electrode (45). In this example the powered electrode (45) is circular with the central indexing hole (3) therethrough. The plurality of holes are disposed in an annular area around the central indexing hole (3). The ground electrode (41) is disposed above the powered electrode (45) separated by a gap (40) where the atmospheric pressure plasma is generated as the gas flow (43) passes through. The ground electrode (41) includes a plurality of holes matching those of the powered electrode (45); the plurality of holes of the ground electrode (41) comprise the showerhead port (4) to the contact surface (44) of the fastener (1). (Note that the plurality of holes of powered electrode (45) is configured similar to the showerhead port (4) of the ground electrode (41) to facilitate smooth passage of the gas flow as it becomes the atmospheric pressure plasma flow.) The powered electrode (45) and the ground electrode (41) are electrically isolated from each other by an electrical insulator (42), e.g. ceramic, which defines the proper gap separation distance between the electrodes (45), (41) as shown. An end cap (5) over the ground electrode (41) can also comprise and insulating material. In this plasma device (100), the gas flow is directed across a gap separating the electrodes (45), (41) though holes to generate the atmospheric pressure plasma.

Figure 3:
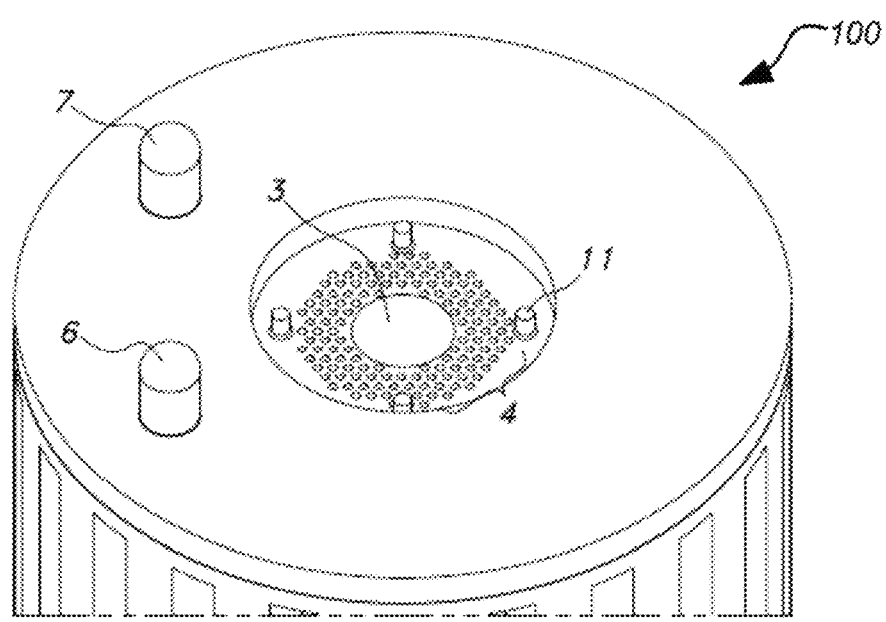
FIG. 3 shows a close up view of the showerhead design of the device. Four metal studs are used as spacers to maintain the optimal distance between the plasma exit holes and the nutplate being treated. A hole in the center accepts the silicone fixture of the nutplate.

A close up view of the top of the plasma device is presented in FIG. 3. The central indexing hole (3) in the center of the device accepts the silicone fixture from the nutplate. Around the hole (3) is the showerhead port (4) where the reactive gas from the plasma flows out of the device. The dimensions of the showerhead range from about 10 to 50 mm in diameter. Although any suitable number and arrangement of standoff posts can be use, in the example there are four standoff posts (11) spaced at 90 degrees from one another. These standoff posts (11) are from 1 to 6 mm in height to provide sufficient atmospheric pressure plasma flow including reactive gases to impact the contact surface (44) of the fastener (1). In this example, the standoff posts (11) are formed directly into the ground electrode (41) as shown. The fastener (1) rests on the standoff posts (or spacers) (11), providing a short distance for the atmospheric pressure plasma flow including the reactive gas to travel from the showerhead port (4) to the contact surface (44) of the fastener (1). A red LED (6) is illuminated to indicate that the plasma is not active and the system is ready to accept a fastener (1). The posts or spacers may be equipped to detect electrical contact with the fastener (1). Detecting electrical contact between the posts (11) and the fastener (1) can be used to trigger the plasma treatment sequence automatically every time a nutplate is inserted and contacts the posts (11) into the device. Once initiated, the plasma sequence will run for a specified period of time after which it will shut itself off and the green LED (7) will indicate successful preparation of the fastener (1) for bonding.

Figure 4:
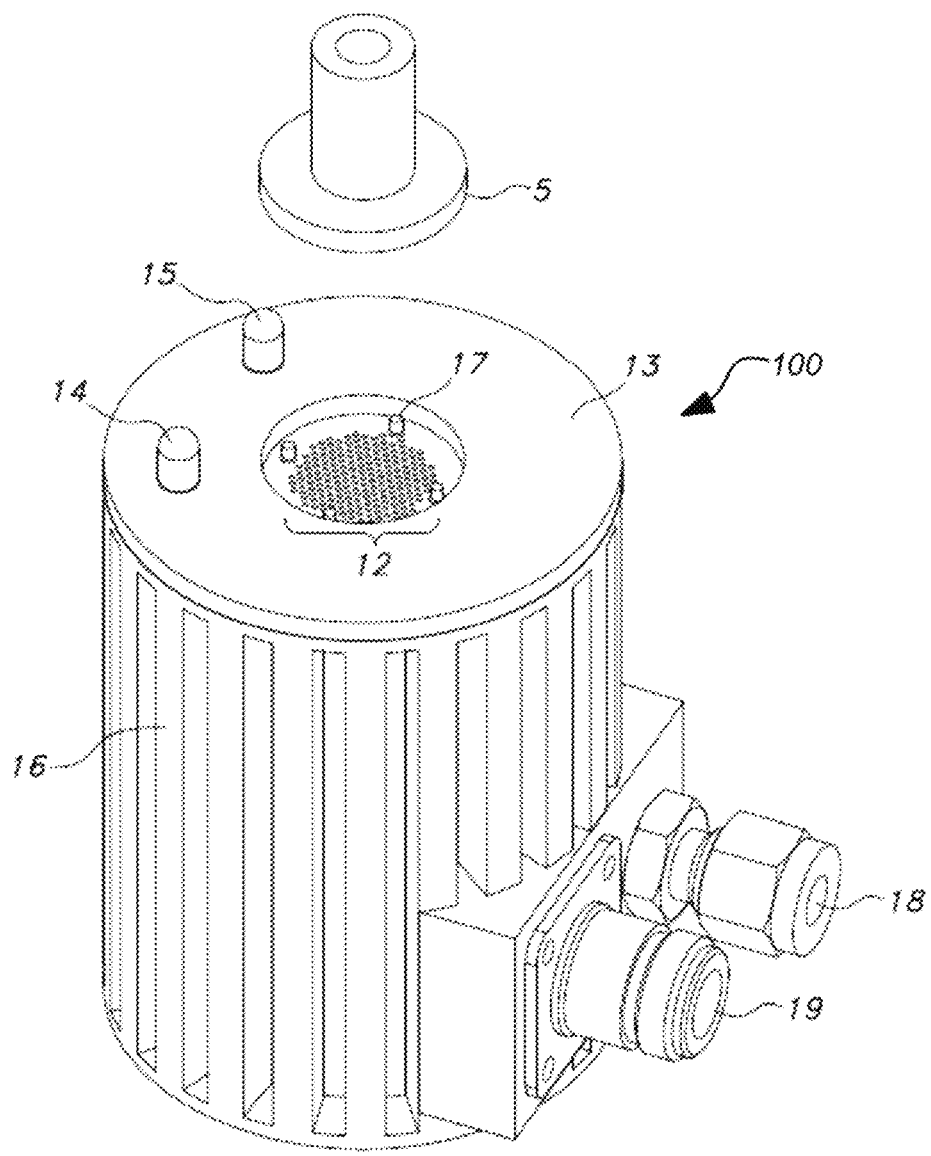
FIG. 4 is a drawing of a showerhead plasma device for treating fasteners with a flat baseplate. Four metal studs are used as spacers to maintain the optimal distance between the plasma exit holes and the surface being treated.

FIG. 4 shows a variation of the showerhead plasma device (100), which is designed to treat fasteners, including, but not limited to, studs, cable tie mounts, and standoffs bushings. This device is essentially identical to that in FIGS. 1A, 1B, 2 and 3 except for the absence of the central indexing hole (3). The internal arrangement of electrodes is also the same as shown in FIG. 1B except for the absence of the central indexing hole (3). It is configured to clean and activate the contact surface (44) e.g. baseplate, present on these fasteners (1). The plasma device is comprised of a showerhead port (12) from which the reactive gases from the plasma are emitted. The diameter of the showerhead port (12) may be sized to accept any type of fastener, e.g. ranging from 10 mm to 50 mm to even larger diameters. This example device (100) also features an insulating end cap (13), light emitting diodes (14 and 15), heat dissipation fins (16), and four standoff posts (or spacers) (17). On the body of the device are a gas inlet (18) and an RF connector (19) to provide gas flow and electricity from the controller to the plasma device. As shown in FIG. 4, the fastener (20) has not yet been inserted into the device, and the red LED (14) is illuminated. Once the fastener (20) is inserted into the device, the plasma gas cleans and activates the bond surface for adhesion. Once treatment is completed, the green LED (15) turns on.

Further embodiments of the invention can include a display to indicate the process status to the operator as well as other information like the process recipe. The device can include an input/output port and cable for data monitoring. The plasma device (100) can be used for handheld treatment of nutplates prior to installation on metal or composite panels. A set of nutplates held in a tray or other fixture can be prepared by manually manipulating the plasma tool over each one. The device can incorporate a pistol grip, which the operator can hold while he manipulates the device over each nutplate. It can also include a start/stop button, or trigger, for initiating and ending plasma generation.

Example 2—Plasma Tool for Nutplate Preparation Via Direct Plasma Activation

A further embodiment of the invention is to generate a plasma discharge directly beneath the fastener or nutplate bonding surface. FIG. 5A is a drawing of an atmospheric pressure plasma device (500) that incorporates the nutplate into the electrical circuit formed by the grounded electrode. The plasma device is constructed with a cylindrical body (21) topped by a cylindrical housing enclosure (22), e.g. a separate removable end cap. Utilities are provided to the device through a radio frequency power connection (23) and process gases enter the body through a compression fitting (24). The body (21) also includes a communications port (25) which can relay the on or off state of the device to an external control unit. A rectangular opening (26) is seen at the top of the cylindrical housing enclosure (22), which is sized to accept a specific mechanical fastener (31) e.g. a nutplate. Note: reference numeral 22 throughout the specification can be interchangeably referred to as "exterior housing enclosure," "end cap," "electrodes," "ground electrode enclosure," "removable enclosure" as can be understood from FIGS. 5A, 5B, 6, 7.

Figure 5B:
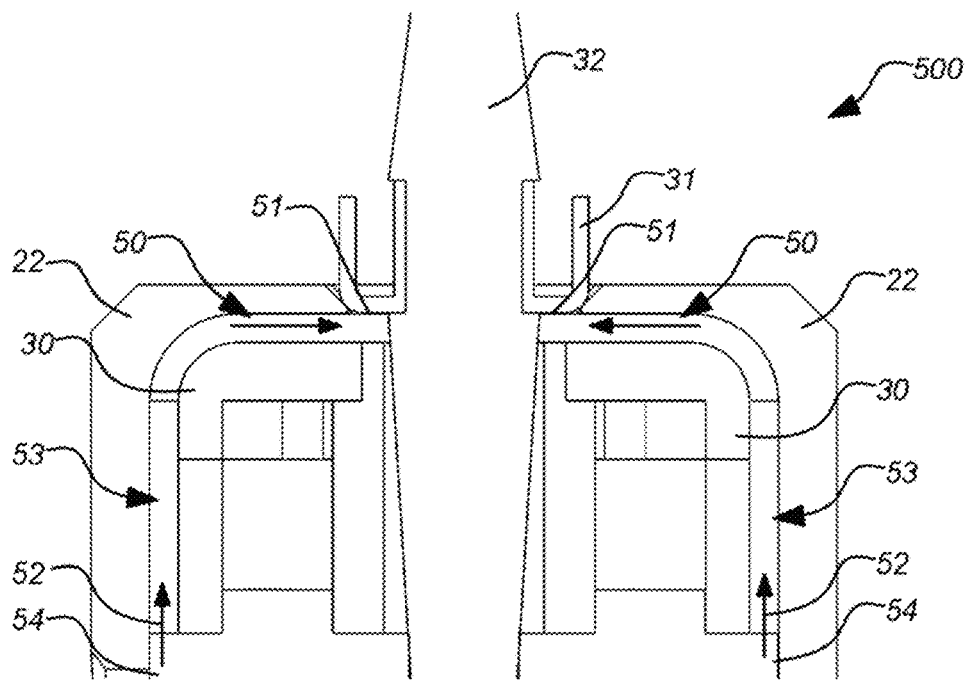
FIG. 5B is a cross section of the device of FIG. 5A.
Figure 5A:
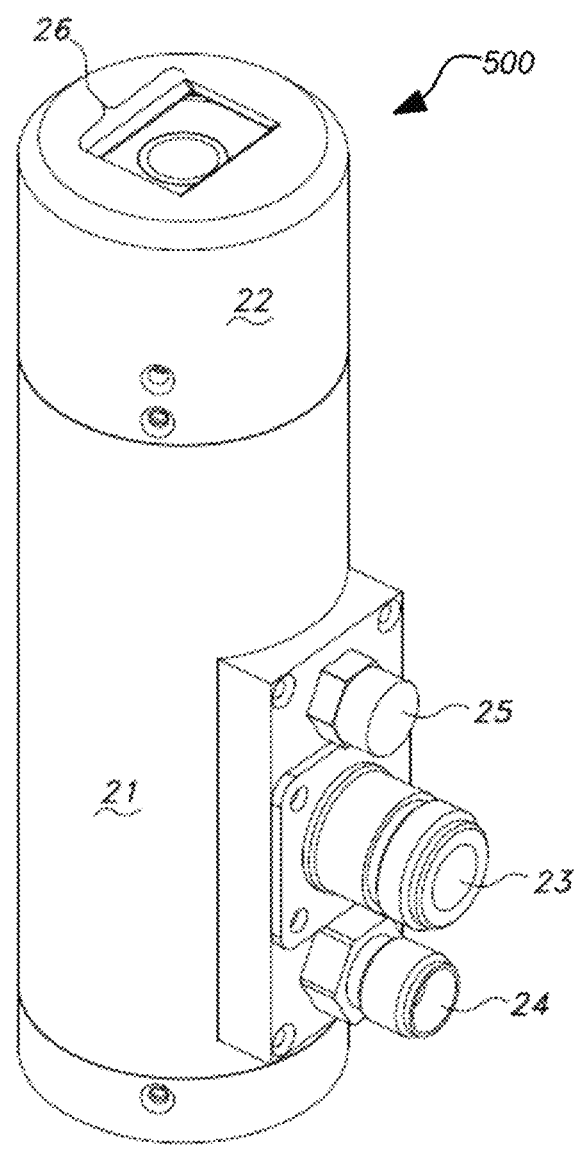
FIG. 5A is a drawing of a device for preparing nutplate surfaces for bonding through the generation of plasma directly beneath the nutplate. The device features a central hole for accepting the silicone fixture and a rectangular cutout in the top that fits a specific nutplate type.

FIG. 5B is a cross section of the device (500) of FIG. 5A showing the arrangement of electrodes and the gas flow from which the atmospheric pressure plasma is generated. In this device (500), the exterior housing enclosure (22) functions as the ground electrode. The gas flow (52) is directed first into a gap formed by a circumferential passage (53) between the exterior housing enclosure (22) and the powered electrode (30) which then turns into a planar passage (50) and ends at a central opening (26). The powered electrode (30) and the ground electrode (22) are electrically isolated from each other by an electrical insulator (54), e.g. ceramic, which defines the proper gap separation distance between the electrodes (30), (22) as shown. In this plasma device (500), the gas flow is directed along (rather than across) a gap separating the electrodes (30), (22) to generate the atmospheric pressure plasma. However, in both devices (100), (500), the powered electrode is circular.

Figure 6:
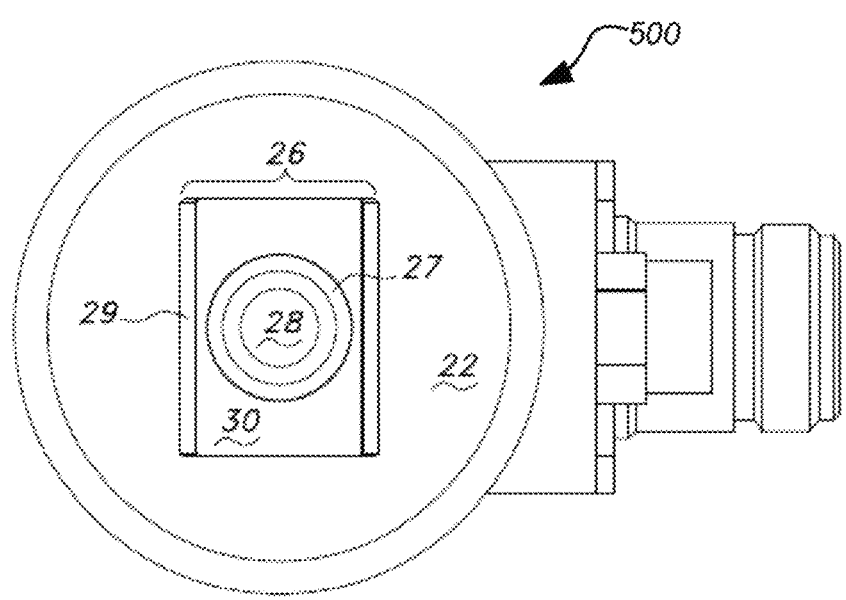
FIG. 6 shows a top down view of the device presented in FIG. 5. A rectangular cutout has been machined into the end cap. Inside is a central ceramic hole that accepts the silicone fixture. Surrounding the hole is the flat powered electrode. Angled walls are present along two sides of the cutout, and provide a means of electrically grounding the nutplate to the plasma device.

FIG. 6 illustrates a top down view of the invention for direct plasma treatment of the mechanical fastener (31). Within the rectangular opening (26) in the end cap (22) is a separate central electrical insulator (27), e.g. ceramic, with an indexing hole (28) in the center. The indexing hole (28) within the separate central electrical insulator (27) is sized to accept the silicone fixture (32) on the particular fastener (31) and to automatically align the fastener (31) within the opening (26). The indexing hole (28) size can be changed with central electrical insulators (27) of different diameters to allow the operator to accurately and securely insert a fastener (31) of any size into the plasma device (500).

The rectangular opening has two edges (29) which are beveled and electrically conducting. When the fastener (31) is inserted into the opening an electrical connection is created between it and the ground electrode enclosure (22). The beveled edges (29) also maintain the proper spacing between the contact surface (51) of the fastener (31) and the powered electrode (30) to match the spacing of the planar passage (50) of the electrode gap. When the device (500) is turned on, radio frequency power is applied to the inner metal electrode (30) causing a plasma discharge to be struck between it and the inside of the end cap (22) and the nutplate generating the atmospheric pressure plasma flow in the gap.

Figure 7:
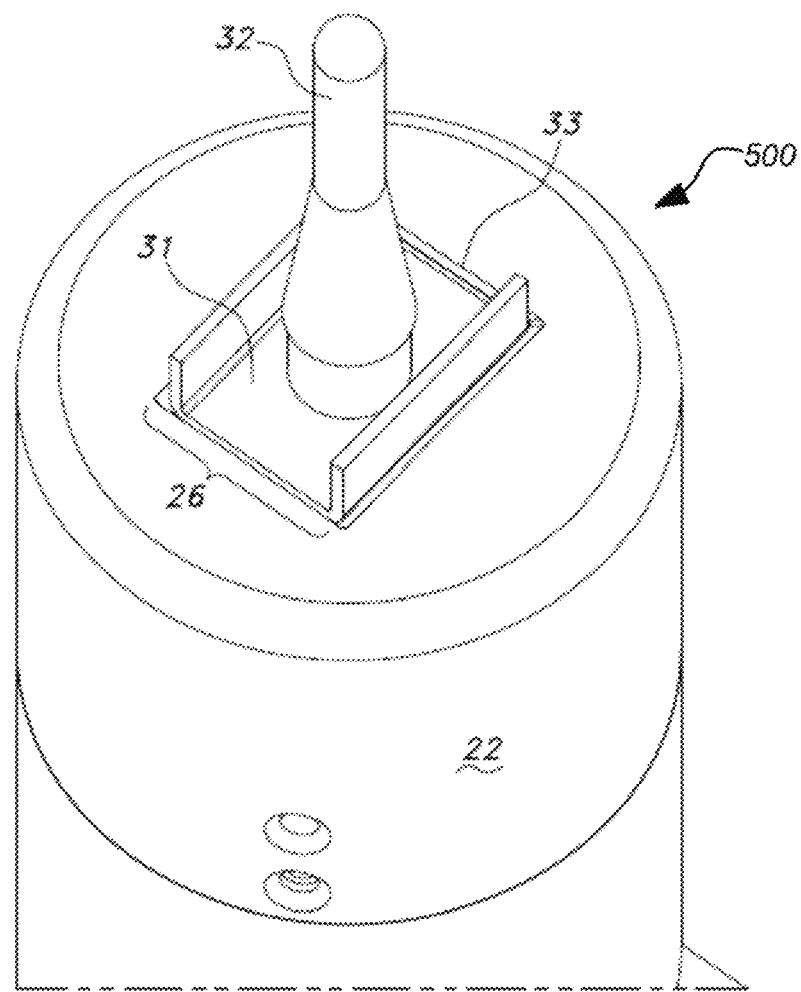
FIG. 7 is a drawing of the device with the nutplate inserted for cleaning. The plasma is struck uniformly beneath the nutplate and is cleaning and activating the metal surface for bonding.

FIG. 7 shows the plasma device in the process of cleaning and activating an open style fastener (31), e.g. nutplate, with silicone fixture (32). To operate the plasma device, the technician inserts the fastener (31) down into the opening (26) so as to ensure electrical contact with the end enclosure (22). Upon pushing the start button, oxygen-containing gases are purged through the device. These gases are distributed in a uniform radial direction beneath the fastener (31) contact surface (51), flowing inward toward the center. Radio frequency power is applied to the inner electrode (30) resulting in breakdown of the gas and the generation of plasma. This example shows light being emitted (33) from the edge of the fastener (31) as expected for a glow discharge. The reactive species impinge on the contact surface (51) of the fastener (31), thereby cleaning and activating it for adhesion.

The tool's rectangular opening can be modified to allow it to prepare a variety of nutplates and fasteners of different shapes and sizes. A removable enclosure (22) enables the operator to install an opening (26) that is specifically designed for any individual style of fastener. Many other enclosures (22) can be employed without deviating from the scope of the invention.

Example 3—Method for Cleaning and Increasing the Surface Energy of Nutplates

For reliable adhesive bonding of nutplates and fasteners, the surface that the glue is applied to must be clean and free of any contaminants. A problem is posed by the presence of airborne contaminants, which are readily adsorbed onto the surface of metals. These naturally occurring adsorbates reduce surface energy and cause poor adhesion between the glue and the metal. This in turn leads to premature failure of joint during the equipment's service life.

The nutplate plasma treater removes contaminants from metal surfaces, thereby activating them for bonding. Gas molecules, such as $O_2$, flow through the plasma and are converted into reactive species, such as O atoms. These reactive species flow out of the device and strip the contamination from the metal surface of the nutplate.

Figure 8:
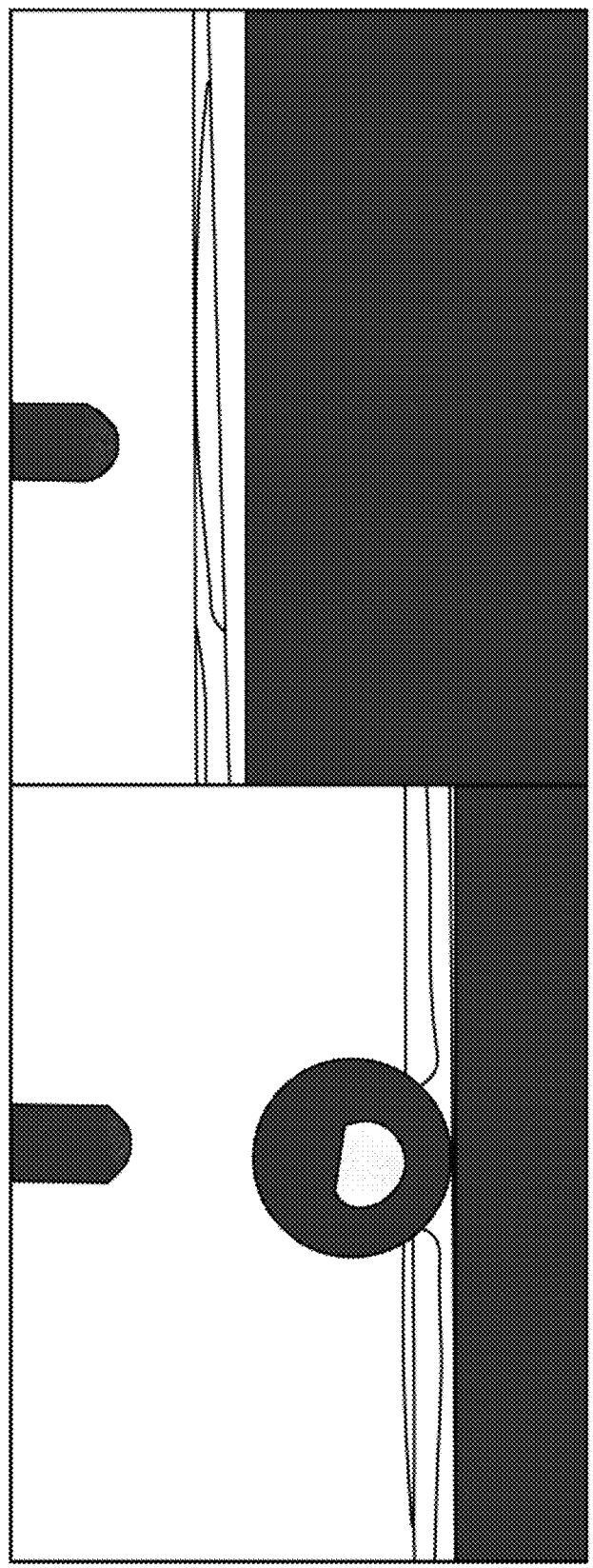
FIG. 8 shows two images of the water contact angle on a (SS) steel nutplate. On the left is a nutplate which has been degreased using DS-108 solvent and is exhibiting hydrophobic behavior. On the right is the same nutplate after cleaning and activation with the atmospheric pressure plasma. The plasma generates a hydrophilic surface with a water contact angle <5°.

Shown in FIG. 8 is the water contact angle of a 1 microliter (μL) droplet on a stainless steel nutplate before and after processing with the nutplate plasma treater using He and $O_2$ feed gases. It was found that the nutplate surface adsorbed a significant amount of contaminants during storage, resulting in a hydrophobic surface with a water contact angle (WCA) exceeding 110°. Cleaning and activation with plasma reduced the water contact angle to less than 5°. Complete wetting of the nutplate surface is achieved after a period of less than 10 seconds of plasma exposure. This high-energy surface will strongly bond to adhesives.

Another example of practicing the invention is to modify the surface of plastic fasteners. For example, the plasma device can be used to change the wettability of a bismaleimide (BMI) part. Table 1 lists the water contact angle for BMI and stainless steel fasteners with and without plasma cleaning. A goniometer was used to make these measurements (Krüss model FM40 with drop shape analysis (DSA3)). For BMI samples, a hydrophobic surface was observed with a water contact angle of 104±2°, even after degreasing with DS-108 solvent. This is in stark contrast to the plasma-treated surface, where the WCA equals 8±1°. Similarly, plasma activation of the SS nutplate produces a hydrophilic surface by decreasing the initial WCA from 114±2° after DS-108 wiping to less than 5° after plasma activation. These results demonstrate that the plasma device produces a hydrophilic, high-energy surface on both materials. These hydrophilic surface will adhere much more strongly and permanently to adhesives than an untreated hydrophobic surface.

TABLE 1

Effect of plasma exposure on the water contact angle (WCA) of BMI and stainless steel fasteners.

| Material | Surface Preparation | Water Contact Angle |
| --- | --- | --- |
| BMI | DS-108 wipe | 104 ± 2 |
| BMI | Plasma | 8 ± 1 |
| SS | DS-108 wipe | 114 ± 2 |
| SS | Plasma | <5 |

Similar results are observed for the activation of other plastic materials, including, but not limited to, polyetheretherketone (PEEK), polyetherketoneketone (PEKK), polyethylene terephthalate PET), polycarbonate (PC), high density polyethylene (HDPE), and epoxy. The materials discussed in this example are not meant to be an exhaustive, and many similar substrate materials could be activated for bonding. In addition, other reactive gases, such as nitrogen, hydrogen, carbon dioxide, and carbon tetrafluoride, etc., could be used to clean and activate fasteners, and would be obvious to those skilled in the art.

Example 4—Method for Increasing the Bond Strength of Nutplates

Figure 9:
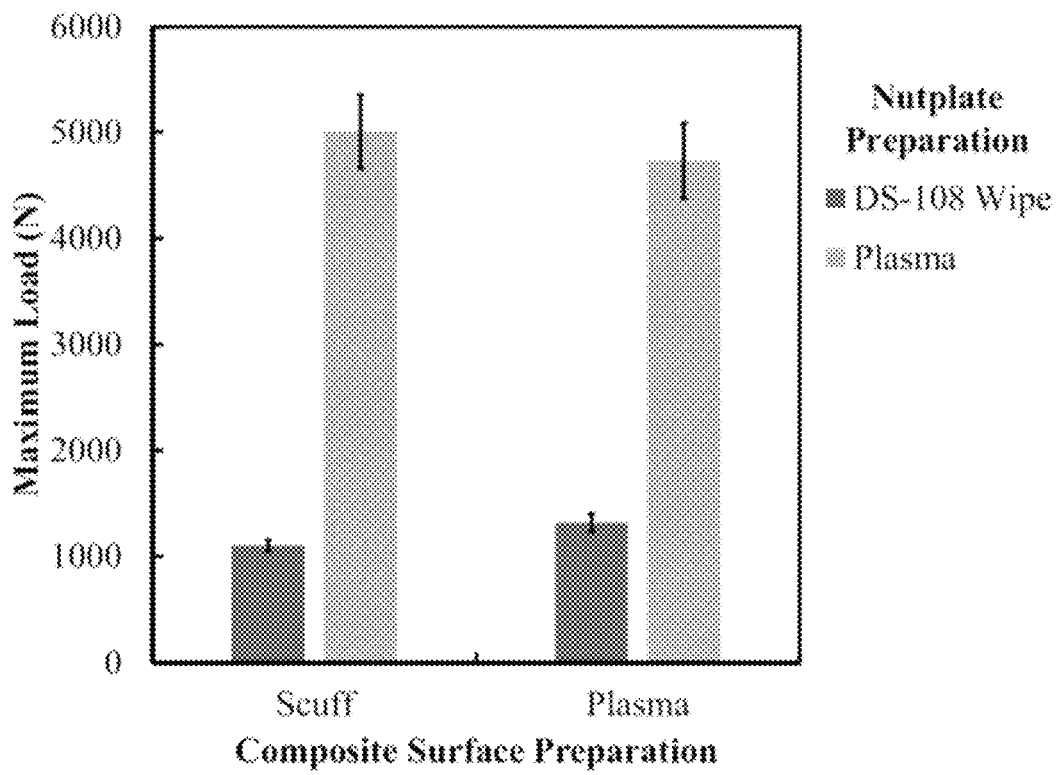
FIG. 9 shows the maximum load for push-out tests as a function of surface preparation method for stainless steel (SS) nutplates bonded to BMI composites. Dome style nutplates were installed onto a BMI composite and loaded with an Instron until failure occurred.

The maximum load before failure during push-out testing of dome style nutplates, with and without plasma activation, is summarized in FIG. 9. Load was applied to each nutplate at a rate of 1.3 mm (0.05 inch) per minute until failure. The strength of the bonded nutplates has been examined after varying the surface treatment of both the laminate and the nutplate. This includes scuffing the the BMI laminate with a Scotch Brite™ abrasive pad, or plasma treatment of the BMI laminate, and wiping the SS nutplate with DS-108 solvent, or plasma treating the SS nutplate.

Plasma activation of the nutplates was performed using an atmospheric pressure plasma system fed with industrial grade helium and oxygen at flow rates of 10 liters per minute (LPM) and 0.2 LPM, respectively. The plasma was ignited at 60 W of RF power and an offset distance of 8 mm was maintained from the applicator to the nutplate surface. Total plasma exposure time for each nutplate was held to 10 seconds. After treatment, the nutplates were bonded to BMI composite panels using CB301 epoxy adhesive supplied by Click Bond, Inc.

Scuffing the laminate accompanied by a DS-108 wipe of the nutplate yielded a push-out strength of 1,102±52 N (248±12 lbf). Plasma activation of the laminate surface followed by a DS-108 wipe of the nutplate increased the push-out strength slightly to 1,317±84 N (296±19 lbf). By contrast, when both the laminate and the nutplate were treated with the plasma, the maximum load jumped to 4,731±355 N (1,064±80 lbf). This is a 360% increase in push-out strength compared to when plasma activation was not used.

Figure 10:
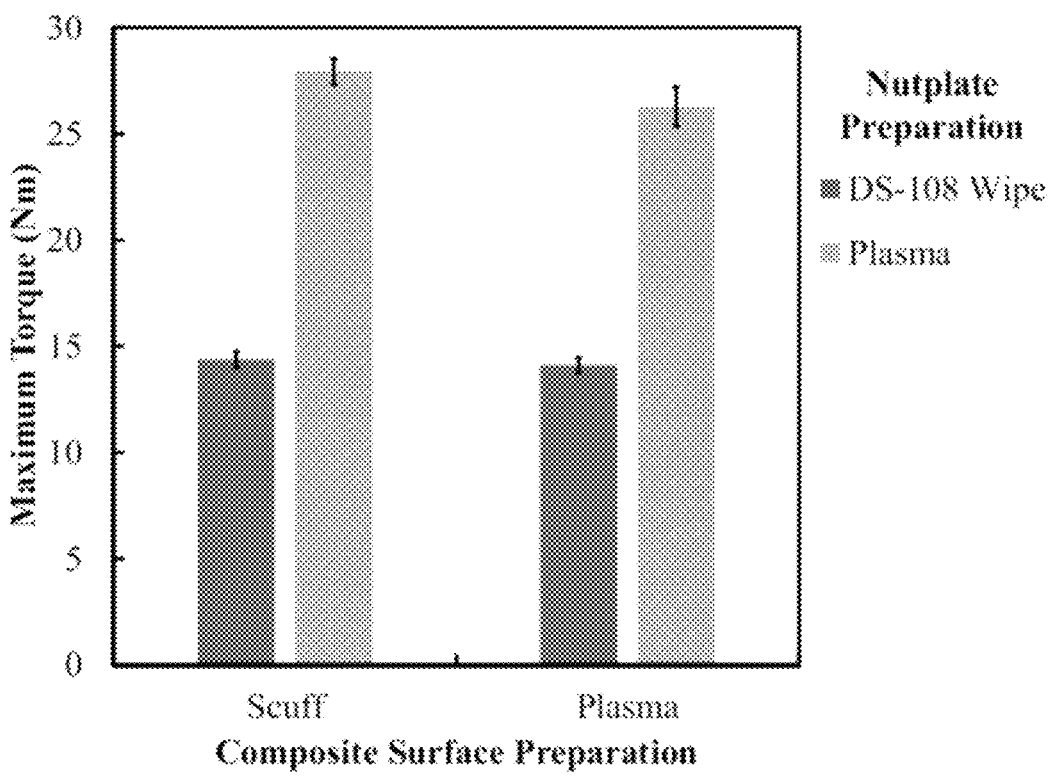
FIG. 10 shows the maximum torque as a function of surface preparation method for stainless steel (SS) nutplates bonded to BMI composites. Torque was applied with a wrench until failure occurred.

The maximum resistance to failure under torsional load for SS nutplates bonded to BMI composites is summarized in FIG. 10. For torque-out testing, a torque wrench was engaged with the nut and torque was applied to the nutplate until the joint failed. Surface preparation of the BMI composite consisted of scuffing them with an abrasive pad, or treating them with the atmospheric pressure plasma. On the other hand, surface preparation of the SS nutplates consisted of wiping the surface with a pad laden with DS-108 solvent, or cleaning and activating it with the plasma. Plasma activation of the SS nutplates was performed using the same conditions described in reference to FIG. 1B above. In addition, CB301 epoxy adhesive from Click Bond, Inc. was used in these tests.

For samples prepared by scuffing the BMI and solvent wiping the nutplate, the torsional load at failure equals 14.4±0.4 Nm (127±4 in·lbf). Plasma activating the BMI instead of scuffing it does not alter the results. The torsional load at failure averages 14.1±0.4 Nm (125±4 in-lbf). If the nutplate is plasma activated and bonded to a scuffed BMI laminate, then the torsional load at failure increases to 27.9±0.6 Nm (247±5 in-lbf). Whereas if both materials are prepared by plasma treatment, the maximum torque value is 26.3±0.9 Nm (233±8 in-lbf). These results show that the invention produces bonded fasteners and nutplates with superior mechanical strength over those prepared by the current, commonly accepted practice.

High-resolution scans of the failure regions on the BMI and nutplate surfaces were captured using a digital microscope. Four different failure modes were observed: adhesive failure at the laminate; adhesive failure at the nutplate; cohesive failure within the adhesive itself; and laminate failure, where the composite substrate fails below the surface rather than at the bond line. The fraction of the bondline which exhibited each failure mode type was calculated for nutplates using both push-out and torque-out testing. The dominant type of failure mode showed a strong dependence on the surface preparation method.

Figure 11:
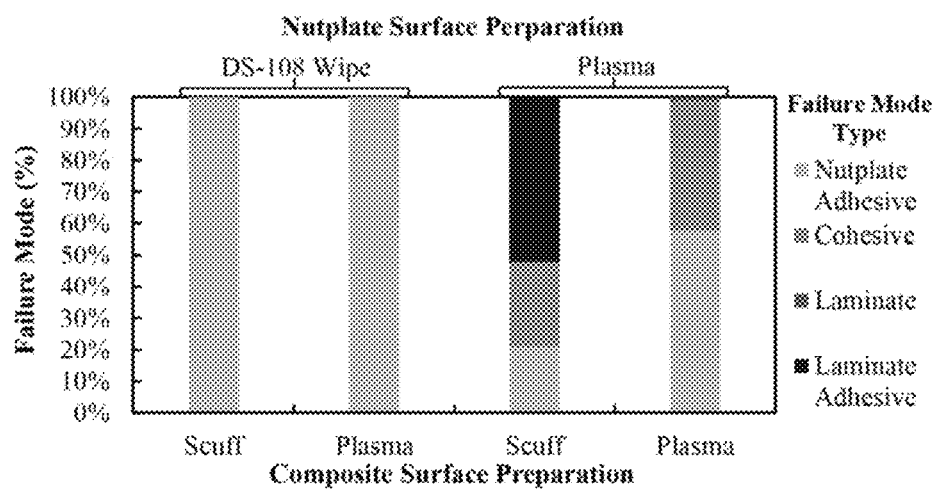
FIG. 11 shows the failure mode for stainless steel (SS) nutplates on BMI following push-out testing.

The failure modes observed after push-out testing are presented in FIG. 11. The top axis of the graph specifies the type of surface preparation performed on the nutplate, while the bottom axis indicates the type of surface preparation performed on the BMI composite. When the nutplate is given no further treatment after wiping with the DS-108 solvent, failure occurs exclusively at the nutplate interface. Regardless of whether the laminate is scuffed or plasma treated, the samples exhibit 100% adhesive failure at the nutplate. This type of failure mode, along with the low push-out strength shown in FIG. 9, indicates that plasma activation of the nutplate is necessary to achieve strong bonds. Plasma activating both the composite and the nutplate shifts the failure mode to 98% within the laminate with no adhesive failure observed at the nutplate interface.

Figure 12:
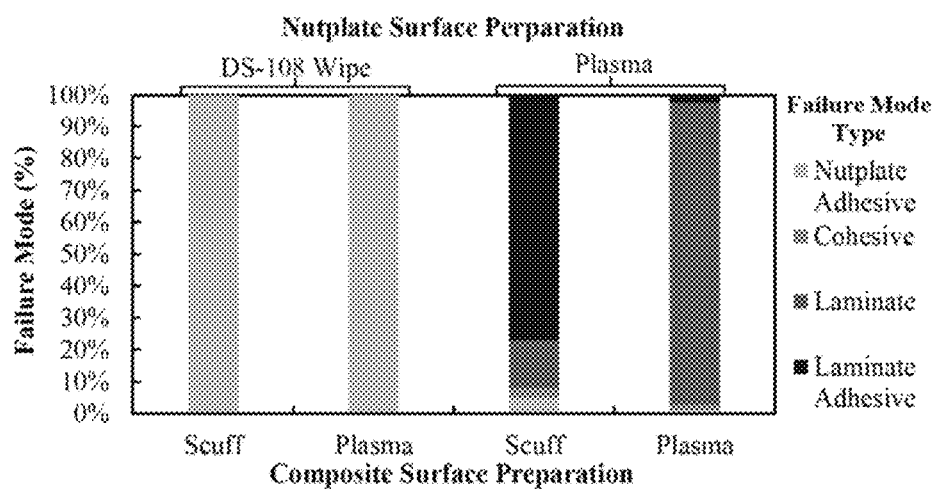
FIG. 12 shows the failure mode for stainless steel (SS) nutplates on BMI after torque-out testing.

Following torque-out testing, the failure mode of each sample was determined. FIG. 12 shows the variation in type of failure mode as a function of surface preparation technique. Once again, the top horizontal axis indicates the nutplate surface preparation method, while the bottom horizontal axis shows the composite preparation technique. Similar trends in failure mode are observed for the torque-out samples as were reported in FIG. 11 for the push-out samples. The failure mode exhibited after wiping the nutplates with DS-108 solvent is 100% adhesive failure at the nutplate, regardless of how the BMI surface was prepared. Plasma treating the nutplate greatly reduces adhesive failure at the nutplate. In the case of plasma activation of both the nutplate and the composite, the failure mechanism was 42% cohesive and 58% nutplate adhesive.

What is claimed is:
1. A method for treating a mechanical fastener with atmospheric pressure plasma comprising:
generating an atmospheric pressure plasma in a housing by flowing gas through a gap between a powered electrode and a grounded electrode and applying electrical power to the powered electrode;
directing the atmospheric pressure plasma flow onto a mechanical fastener by mounting the mechanical fastener in an opening in the housing where the atmospheric pressure plasma flows out from between the powered electrode and the grounded electrode; and
exposing a surface of the mechanical fastener to the atmospheric pressure plasma flow with a spacer in contact with the mechanical fastener receiving the atmospheric pressure plasma flow onto the surface of the mechanical fastener;
wherein the spacer is disposed on an opposite side of the grounded electrode from the powered electrode and between and in contact with both the mechanical fastener and the grounded electrode and outside the gap between the powered electrode and the grounded electrode to receive the atmospheric pressure plasma flow from out of the gap.

2. The method of claim 1, wherein the spacer comprises opposing beveled edges of a central rectangular opening for supporting edges of the contact surface of the mechanical fastener.

3. The method of claim 2, wherein the grounded electrode of the plasma generator comprises a housing enclosure having the central rectangular opening.

4. The method of claim 3, wherein the contact surface of the mechanical fastener is electrically conductive and makes electrical contact with the opposing beveled edges such that a portion of the atmospheric pressure plasma is generated directly between the powered electrode and the contact surface of the mechanical fastener.

5. The method of claim 3, wherein the central rectangular opening comprises a central indexing hole for receiving an extended portion of the mechanical fastener and thereby aligning the mechanical fastener in the central rectangular opening so that the contact surface of the mechanical fastener is uniformly impacted with the atmospheric pressure plasma flow.

6. The method of claim 1, wherein the spacer is a plurality of standoffs supporting the contact surface of the mechanical fastener and maintaining a space to allow the atmospheric pressure plasma flow to uniformly impact the contact surface of the mechanical fastener.

7. The method of claim 6, wherein the plurality of standoffs are formed on a showerhead port including a plurality of holes through which the atmospheric pressure plasma flow is directed to the contact surface of the mechanical fastener.

8. The method of claim 7, wherein the grounded electrode comprises the showerhead port.

9. The method of claim 1, wherein the electrical power supplied to the powered electrode is in radio frequency range.

10. The method of claim 1, wherein the contact surface of the mechanical fastener is impacted with reactive species from an atmospheric pressure plasma containing an inert gas, and a molecular gas selected from the group comprising oxygen, nitrogen, hydrogen, carbon dioxide, and nitrous oxide.

* * * * *